United States Patent
Yim et al.

(10) Patent No.: US 9,570,706 B2
(45) Date of Patent: Feb. 14, 2017

(54) ORGANIC LIGHT-EMITTING DIODE (OLED) DISPLAY HAVING A PLURALITY OF SPACERS COVERING ONE OR MORE VIA HOLES

(71) Applicant: Samsung Display Co., Ltd., Yongin, Gyeonggi-Do (KR)

(72) Inventors: Sang-Hoon Yim, Yongin (KR); Won-Jong Kim, Yongin (KR); Dong-Kyu Seo, Yongin (KR); Young-Woo Song, Yongin (KR); Seok-Gyu Yoon, Yongin (KR); Jong-Hyuk Lee, Yongin (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/322,700

(22) Filed: Jul. 2, 2014

(65) Prior Publication Data

US 2015/0200237 A1  Jul. 16, 2015

(30) Foreign Application Priority Data

Jan. 14, 2014 (KR) .......................... 10-2014-0004709

(51) Int. Cl.
*H01L 29/18* (2006.01)
*H01L 33/00* (2010.01)
(Continued)

(52) U.S. Cl.
CPC ......... *H01L 51/525* (2013.01); *G02F 1/13394* (2013.01); *G02F 1/136227* (2013.01); *H01L 27/1248* (2013.01); *H01L 27/3216* (2013.01); *H01L 27/3218* (2013.01); *H01L 27/3246* (2013.01); *H01L 27/3248* (2013.01);
(Continued)

(58) Field of Classification Search
CPC ............ H01L 27/3258; H01L 27/3246; H01L 27/1248; H01L 27/3248; H01L 29/786; G02F 1/136227; G02F 1/13394
See application file for complete search history.

(56) References Cited

U.S. PATENT DOCUMENTS 5,311,337 A * 5/1994 McCartney, Jr. . G02F 1/133514
349/109
6,727,964 B2 * 4/2004 Tanaka .............. G02F 1/133514
349/106
(Continued)

FOREIGN PATENT DOCUMENTS

KR  10-2007-0000528 A  1/2007
KR  10-2013-0007006 A  1/2013
(Continued)

*Primary Examiner* — Jesse Y Miyoshi
(74) *Attorney, Agent, or Firm* — Knobbe, Martens, Olson & Bear, LLP

(57) ABSTRACT

An organic light-emitting diode (OLED) display is disclosed. In one aspect, the OLED display comprises a display substrate, an encapsulation substrate, and at least one spacer. The display substrate includes a non-pixel area, wherein a plurality of via holes is formed in the non-pixel area. The encapsulation substrate is formed over the display substrate. The spacer is formed between the display substrate and the encapsulation substrate so as to maintain a gap therebetween, wherein the spacer at least partially covers at least one of a plurality of via holes.

19 Claims, 4 Drawing Sheets

(51) Int. Cl.
  *H01L 51/52* (2006.01)
  *H01L 27/32* (2006.01)
  *G02F 1/1339* (2006.01)
  *H01L 27/12* (2006.01)
  *G02F 1/1362* (2006.01)

(52) U.S. Cl.
  CPC ...... *H01L 27/3258* (2013.01); *H01L 27/3276* (2013.01); *H01L 51/524* (2013.01); *H01L 51/5209* (2013.01)

(56) References Cited

U.S. PATENT DOCUMENTS

| | | | | |
|---|---|---|---|---|
| 8,872,184 | B2* | 10/2014 | Chen | G02F 1/13394 257/72 |
| 2004/0222467 | A1* | 11/2004 | Yamazaki | H01L 27/1214 257/351 |
| 2005/0156174 | A1* | 7/2005 | Murakami | H01L 28/40 257/72 |
| 2006/0158095 | A1* | 7/2006 | Imamura | H01L 27/3279 313/500 |
| 2006/0197441 | A1* | 9/2006 | Tsai | H01L 27/3246 313/506 |
| 2007/0108899 | A1* | 5/2007 | Jung | H01L 27/3276 313/506 |
| 2009/0039773 | A1* | 2/2009 | Jun | H01L 27/3246 313/504 |
| 2009/0315458 | A1* | 12/2009 | Choi | H01L 27/3276 313/505 |
| 2013/0001533 | A1 | 1/2013 | Kim et al. | |
| 2013/0021552 | A1 | 1/2013 | Tomioka et al. | |
| 2014/0284572 | A1* | 9/2014 | Oooka | H01L 51/525 257/40 |

FOREIGN PATENT DOCUMENTS

| | | |
|---|---|---|
| KR | 10-2013-0011981 A | 1/2013 |
| KR | 10-2013-0071823 A | 7/2013 |

* cited by examiner

ORGANIC LIGHT-EMITTING DIODE (OLED) DISPLAY HAVING A PLURALITY OF SPACERS COVERING ONE OR MORE VIA HOLES

CROSS-REFERENCE TO RELATED APPLICATIONS

This application claims priority from and the benefit of Korean Patent Application No. 10-2014-0004709, filed on Jan. 14, 2014, which is hereby incorporated by reference for all purposes as if fully set forth herein.

BACKGROUND

Field

The described technology generally relates to an organic light-emitting diode (OLED) display.

Description of the Related Technology

An organic light-emitting diode (OLED) display is a self-emissive display device provided with an OLED including a hole injection electrode, an electron injection electrode, and an organic emission layer formed therebetween. In the OLED display, light is generated as excitons due to the combination of holes injected from the hole injection electrode and electrons injected form the electron injection electrode.

The OLED display does not require an additional light source, and thus can be made thin and light and driven with low voltage. Furthermore, the OLED display has a wide viewing angle, high contrast, and high response speed. Due to such high-grade characteristics, the OLED display has received attention as a next-generation display apparatus.

In general, the OLED display includes a plurality of pixels that emit different colors to display an image.

A pixel represents the smallest unit of an image displayed on a display device. A gate line for driving each pixel, a data line, a power line, and an insulating layer such as a pixel defining layer for defining an area or the shape of each pixel can be formed between adjacent pixels.

SUMMARY OF CERTAIN INVENTIVE ASPECTS

One inventive aspect is an organic light-emitting display apparatus that includes a display substrate including a plurality of pixel areas divided by a non-pixel area, an encapsulation substrate formed opposite to the display substrate, and a spacer formed on the non-pixel area of the display substrate, and formed between the display substrate and the encapsulation substrate to maintain a gap between the display substrate and the encapsulation substrate, wherein the spacer covers at least one of a plurality of via holes in the non-pixel area.

The spacer can cover two adjacent via holes among the plurality of via holes.

The spacer can cover three adjacent via holes among the plurality of via holes.

At least one surface of the spacer can contact with an interface of the pixel area.

From a top view of the spacer, the spacer can have one of shapes of a polygon, a circle, and an ellipse.

At least one of the plurality of via holes can be connected to a transistor for diving the plurality of pixel areas.

Each of the plurality of pixel areas can include a pixel electrode, an intermediate layer including an organic emission layer, and an opposite electrode, wherein a part of the plurality of via holes are formed in the pixel electrode.

A part of the plurality of via holes can be formed in a wiring formed between the plurality of pixel areas.

The wiring can be a supply line of initializing power for initializing the plurality of pixel areas.

The plurality of pixel areas can include a first pixel, a second pixel spaced apart from the first pixel and having a center positioned on a first vertex of a virtual quadrangle having a center positioned on a center of the first pixel, and a third pixel spaced apart from the second pixel and having a center positioned on a second vertex adjacent to the first vertex of the virtual quadrangle.

The second pixel can be provided in plurality, and the plurality of second pixels can be spaced apart from each other having the first pixel therebetween.

The third pixel can be provided in plurality, and the plurality of third pixels can be spaced apart from each other having the first pixel therebetween.

The second pixel and the third pixel can be provided in plurality, and the plurality of second pixels and the plurality of third pixels can be alternately formed on a virtual line so as to surround the first pixel.

The second pixel and the third pixel can behave larger areas than that of the first pixel.

The first to third pixels can emit light of different colors.

The first to third pixels can emit green light, blue light, and red light respectively.

Another aspect is an organic light-emitting diode (OLED) display, comprising a display substrate, an encapsulation substrate, and a plurality of spacers. The display substrate includes a plurality of pixel areas and a non-pixel area, wherein the non-pixel area surrounds and separates the pixel area and wherein a plurality of via holes is formed in the non-pixel area. The encapsulation substrate faces the display substrate. The plurality of spacers are formed on the non-pixel area between the display substrate and the encapsulation substrate so as to maintain a gap between the display substrate and the encapsulation substrate, wherein each of the spacers at least partially covers at least one of the via holes.

In the above OLED display, the spacers at least partially cover two adjacent ones of the via holes.

In the above OLED display, the spacers at least partially cover three adjacent ones of the via holes.

In the above OLED display, at least one edge of each spacer contacts an edge of the pixel area.

In the above OLED display, from a top view of each spacer, the spacer has one of the following shapes: a polygon, a circle, or an ellipse.

In the above OLED display, at least one of the via holes is electrically connected to a transistor configured to drive the pixel areas.

In the above OLED display, each of the pixel areas comprises a pixel electrode, an intermediate layer including an organic emission layer, and an opposite electrode, and wherein a portion of at least one of the via holes is formed in the pixel electrode.

In the above OLED display, a portion of at least one of the via holes is formed in a wiring formed between the pixel areas. In the above OLED display, the wiring is a supply line configured to supply power for initializing the pixel areas.

In the above OLED display, the pixel areas comprise a first pixel, at least one second pixel, and at least one third pixel. In the above OLED display, the at least one second pixel is spaced apart from the first pixel and has a center positioned on a first vertex of a virtual quadrangle, wherein the virtual quadrangle has a center positioned on a center of the first pixel. In the above OLED display, the at least one third pixel is spaced apart from the second pixel and has a center positioned on a second vertex adjacent to the first vertex.

In the above OLED display, the at least one second pixel comprises a plurality of the second pixels, and the second pixels are spaced apart from one another having the first pixel therebetween.

In the above OLED display, the at least one third pixel comprises a plurality of the third pixels, and the third pixels are spaced apart from one another having the first pixel therebetween.

In the above OLED display, the at least one second pixel comprises a plurality of the second pixels and the at least one third pixel comprises a plurality of the third pixels, and wherein the second pixels and the third pixels are alternately formed on a virtual line so as to substantially surround the first pixel.

In the above OLED display, each of the second and third pixels has a larger area than that of the first pixel.

In the above OLED display, the first to third pixels are configured to emit light of different colors.

In the above OLED display, the first to third pixels are configured to emit green light, blue light, and red light, respectively.

In the above OLED display, each of the spacers substantially completely covers the via hole.

Another aspect is an organic light-emitting diode (OLED) display, comprising a display substrate, an encapsulation substrate, and at least one spacer. The display substrate includes a non-pixel area, wherein a plurality of via holes are formed in the non-pixel area. The encapsulation substrate is formed over the display substrate. The at least one spacer is formed between the display substrate and the encapsulation substrate so as to maintain a gap therebetween, wherein the spacer at least partially covers at least one of the via holes.

In the above OLED display, the spacer substantially covers two or three adjacent ones of the via holes.

In the above OLED display, from a top view of each spacer, the spacer has one of the following shapes: a polygon, a circle, or an ellipse.

DETAILED DESCRIPTION OF CERTAIN INVENTIVE EMBODIMENTS

Figure 1:
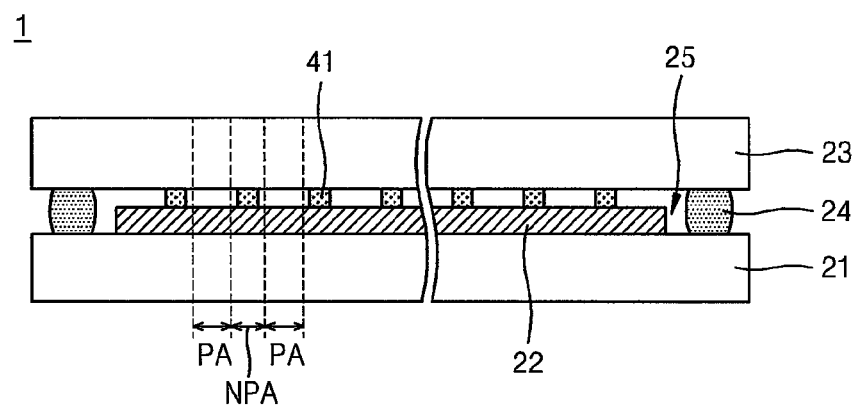
FIG. 1 is a schematic cross-sectional view of an organic light-emitting diode (OLED) display according to an embodiment.

Reference will now be made in detail to embodiments, examples of which are illustrated in the accompanying drawings, wherein like reference numerals refer to like elements throughout. In this regard, the present embodiments can have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Embodiments of the described technology can be variously modified and can include various examples. However, particular embodiments are exemplarily illustrated in the drawings and will be described in detail. Effects and features of the embodiments of the described technology, and implementation methods thereof will be clarified through following embodiments described with reference to the accompanying drawings. However, the described technology is not limited to the embodiments described below, but can be implemented in various forms.

Hereinafter, embodiments of the described technology will be described in detail with reference to the accompanying drawings. Like reference numerals refer to like elements throughout, and overlapped descriptions are omitted.

It will be understood that although the terms "first", "second", etc. can be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto. In this disclosure, the term "substantially" means completely, almost completely or to any significant degree.

FIG. 1 is a schematic cross-sectional view of an organic light-emitting diode (OLED) display 1 according to an embodiment.

Referring to FIG. 1, the OLED display apparatus 1 includes an organic light-emitting unit 22 formed on a display substrate 21 and an encapsulation substrate 23 for encapsulating the organic light-emitting unit 22: The OLED display 1 also includes a spacer 41 formed between the display substrate 21 and the encapsulation substrate 23 so as to maintain a gap therebetween.

The display substrate 21 and the organic light-emitting unit 22 can include a plurality of non-pixel areas NPA and a plurality of pixel areas PA separated by the non-pixel areas NPA.

The non-pixel area NPA, in which light is not irradiated, can be a non-emission area. Therefore, in some embodiments, the non-pixel area NPA is not provided with a light-emitting structure for emitting light. In some embodiments, the non-emission area can include at least a part of the light-emitting structure and can be blocked from emitting light by a light shielding structure.

The pixel area PA, in which light can be irradiated, can include a light-emitting structure. For example, each pixel area PA can include an OLED. The pixel areas PA can be formed in a matrix form.

The organic light-emitting unit 22 can include a plurality of OLEDs for emitting one of red, green, blue, and white light. This will be described later.

The encapsulation substrate 23 can be formed of a transparent material so that an image of the organic light-emitting unit 22 is displayed and so that oxygen and moisture can be prevented from infiltrating into the organic light-emitting unit 22.

Edge portions of the display substrate 21 and the encapsulation substrate 23 can be combined with each other by a sealing member 24. Accordingly, an inner space 25 between the display substrate 21 and the encapsulation substrate 23 can be sealed. A moisture absorbent or a filler can be formed in the inner space 25.

The spacer 41 can be formed in the non-pixel area NPA between the display substrate 21 and the encapsulation substrate 23. The spacer 41 can be provided so as to prevent display characteristics from being degraded due to external impact.

Figure 2:
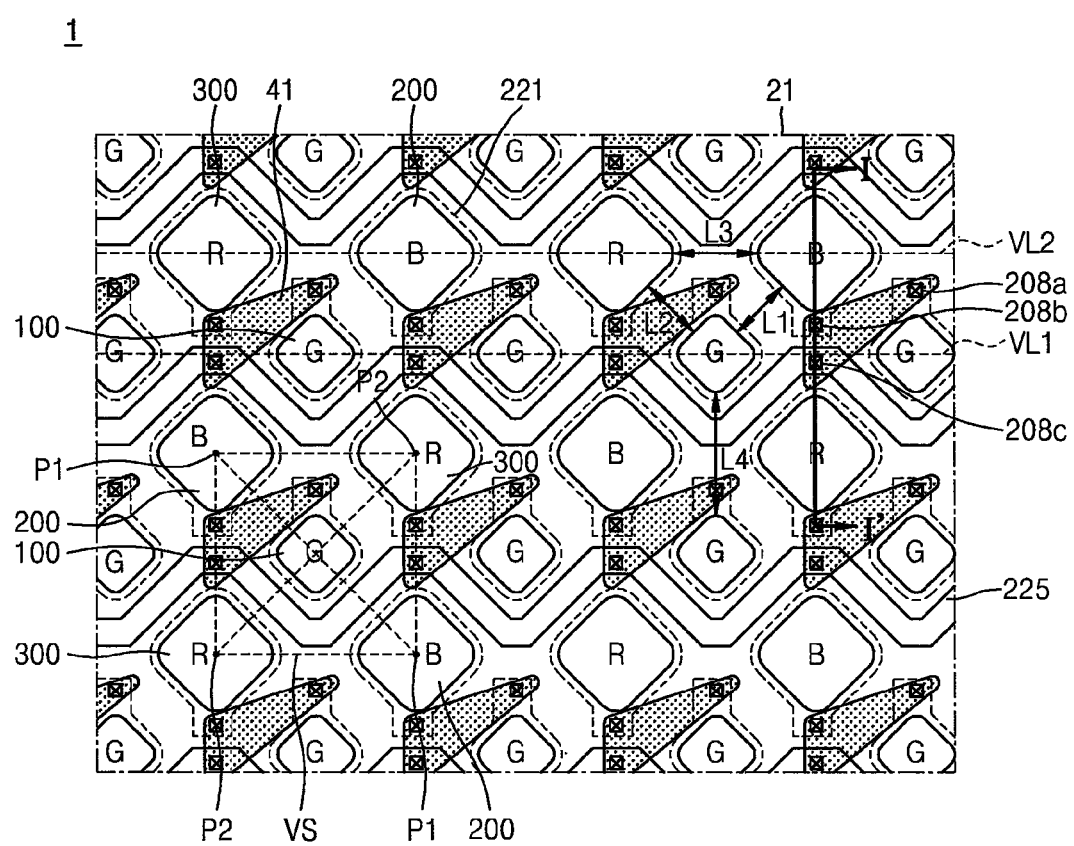
FIG. 2 is a partial planar view of the OLED display.

FIG. 2 is a partial planar view of the OLED display 1 of FIG. 1.

Referring to FIG. 2, the pixel areas of the OLED display 1 include a plurality of first pixels 100, a plurality of second pixels 200, and a plurality of third pixels 300.

T first pixel 100 can have a smaller area than each of the adjacent second and third pixels 200 and 300. The first pixel 100 can have a polygonal shape, more specifically, a quadrilateral shape. In some embodiments, the polygonal shape or the quadrilateral shape includes a rounded polygon or quadrangle. That is, the first pixel 100 can have the shape of a rounded quadrangle.

The first pixels 100 can have substantially the same quadrilateral shape. The first pixels 100 can be spaced apart from one another to be formed on a first virtual line VL1. The first pixel 100 can emit green light, and can include an organic emission layer for emitting the green light.

The second pixel 200 can be formed on a first vertex P1 of a virtual quadrangle VS of which the center is that of the first pixel 100. The third pixel 300 can be formed on a second vertex P2 of the virtual quadrangle VS. The virtual quadrangle VS can be a square.

The second pixel 200 can be spaced apart from the first pixel 100 and can have the center positioned on the first vertex P1. The second pixel 200 can have a larger area than that of the adjacent first pixel 100. The second pixel 200 can have a polygonal shape, more specifically, a quadrilateral shape. The second pixels 200 can have substantially the same quadrilateral shape. The second pixels 200 can be spaced apart from one another having the first pixel 100 therebetween. The second pixel 200 can emit blue light, and can include an organic emission layer for emitting the blue light.

The third pixel 300 can be spaced apart from the first pixel 100 and the second pixel 200 and has the center positioned on the second vertex P2 adjacent to the first vertex P1. The third pixel 300 can have a larger area than that of the adjacent first pixel 100 and substantially the same area as that of the second pixel 200. The third pixel 300 can have a polygonal shape, more specifically, a quadrilateral shape. The third pixels 300 can have substantially the same quadrilateral shape. The third pixels 300 can be spaced apart from one another having the first pixel 100 therebetween. The third pixel 300 can emit red light, and can include an organic emission layer for emitting the red light.

The third pixels 300 and the second pixels 200 can be alternately formed on a second virtual line VL2. Therefore, the second pixels 200 and the third pixels 300 can substantially surround the first pixel 100.

The above-mentioned pixels 100, 200, and 300 can be formed such that gaps among the first to third pixels 100, 200, and 300 have a first length L1, a second length L2, or a third length L3. A gap between adjacent first pixels 100 can have a fourth length L4 greater than the first length L1, the second length L2, or the third length L3.

Therefore, when a deposition process is performed using a metal mask to form an organic green light-emitting layer, an organic blue light-emitting layer, and an organic red light-emitting layer included in the first to third pixels 100 to 300, the reliability of deposition can be improved.

Furthermore, because the second pixels 200 and the third pixels 300 substantially surround the first pixel 100, an aperture ratio of each of the first to third pixels 100 to 300 can be improved. This improvement can reduce the manufacturing cost and the manufacturing time of the OLED display and can also improve the quality of an image displayed on the OLED display.

In some embodiments, according to a pixel arrangement of the present disclosure, gaps among pixels of the same color are wide so that the reliability of deposition is improved. The gaps among different color pixels constituting subpixels are narrow so that the aperture ratio can be improved.

As described above, according to the pixel arrangement of the OLED display of a first embodiment, the first to third pixels 100 to 300 do not merely have polygonal shapes, but the pixels can be formed such that the center of the first pixel 100 is positioned on the center of the virtual quadrangle VS, the center of the second pixel 200 is positioned on the first vertex P1, and the center of the third pixel 300 is positioned on the second vertex P2. The pixel arrangement can improve the aperture ratio of each of the first to third pixels 100 to 300 with improvement in the reliability of deposition of organic emission layers during the deposition process using the metal mask.

In the pixel arrangement of the OLED display 1 according to an embodiment, the first to third pixels 100 to 300 emit green, blue, and red light, respectively. However, in a pixel arrangement of the OLED display according to another embodiment of the present disclosure, the first to third pixels 100 to 300 can emit light of colors that are different from those illustrated in the drawings. For example, at least one of the second pixel 200 and the third pixel 300 can emit white light.

Furthermore, the shapes of the first to third pixels 100 to 300 are not limited by the drawings. For example, the first to third pixels 100 to 300 can have various shapes such as a circular shape, an elliptic shape, and a polygonal shape. In some embodiments, the first pixel 100 can have a quadrilateral shape, and the second and third pixels 200 and 300 can have an octagonal shape.

Each of the plurality of pixel areas can include a pixel electrode 221, intermediate layers 221B and 221R (see FIG. 3) including organic emission layers, and an opposite electrode 222. The pixel electrode 221 can include first and second via holes 208a and 208b electrically connected to driving devices for driving the pixel areas. The first and second via holes 208a and 208b can be formed at an edge of the pixel electrode 221. The first and second via holes 208a and 208b can be formed on a non-emission area.

A wiring 225 can be formed between the pixel areas on the display substrate 21. The wiring 225 can be a data line, a scan line or a power supply line, but is not limited thereto. The wiring 225 can include a third via hole 208c. The wiring 225 can send and receive electric signals to and from another device through the third via hole 208c.

The wiring 225 can be formed on the same layer as the pixel electrode 221. In some embodiments, the wiring 225 can be a supply line of initializing power for initializing the first to third pixels 100 to 300.

The second via hole 208b of the wiring 225 can be formed adjacent to the second via hole 208a or third via hole 208c of the pixel electrode 221.

The via holes 208a to 208c formed on the display substrate 21 can electrically connect elements, and can be formed of metal. Therefore, the via holes can reflect light incident from the outside. The reflection can degrade visibility of the OLED display 1.

In the present embodiments, the spacer 41 can prevent display characteristics from being degraded due to external impact, and can be regularly formed on the non-emission areas. The spacer 41 can be formed so as to at least partially or substantially cover at least one of the first to third via holes 208a to 208c so as to absorb light incident to and reflected from the first to third via holes 208a to 208c. Therefore, the intensity of reflected external light can be reduced.

Referring to FIG. 2, the spacer 41 can at least partially cover the three via holes 208a to 208c that are adjacent to one another. From a top view of the spacer 41, the spacer 41 is shaped like a triangle having the first to third via holes 208a to 208c as vertices thereof. However, the spacer 41 is not limited thereto, and can have various shapes such as a polygonal shape, a circular shape, and an elliptic shape.

Figure 3:
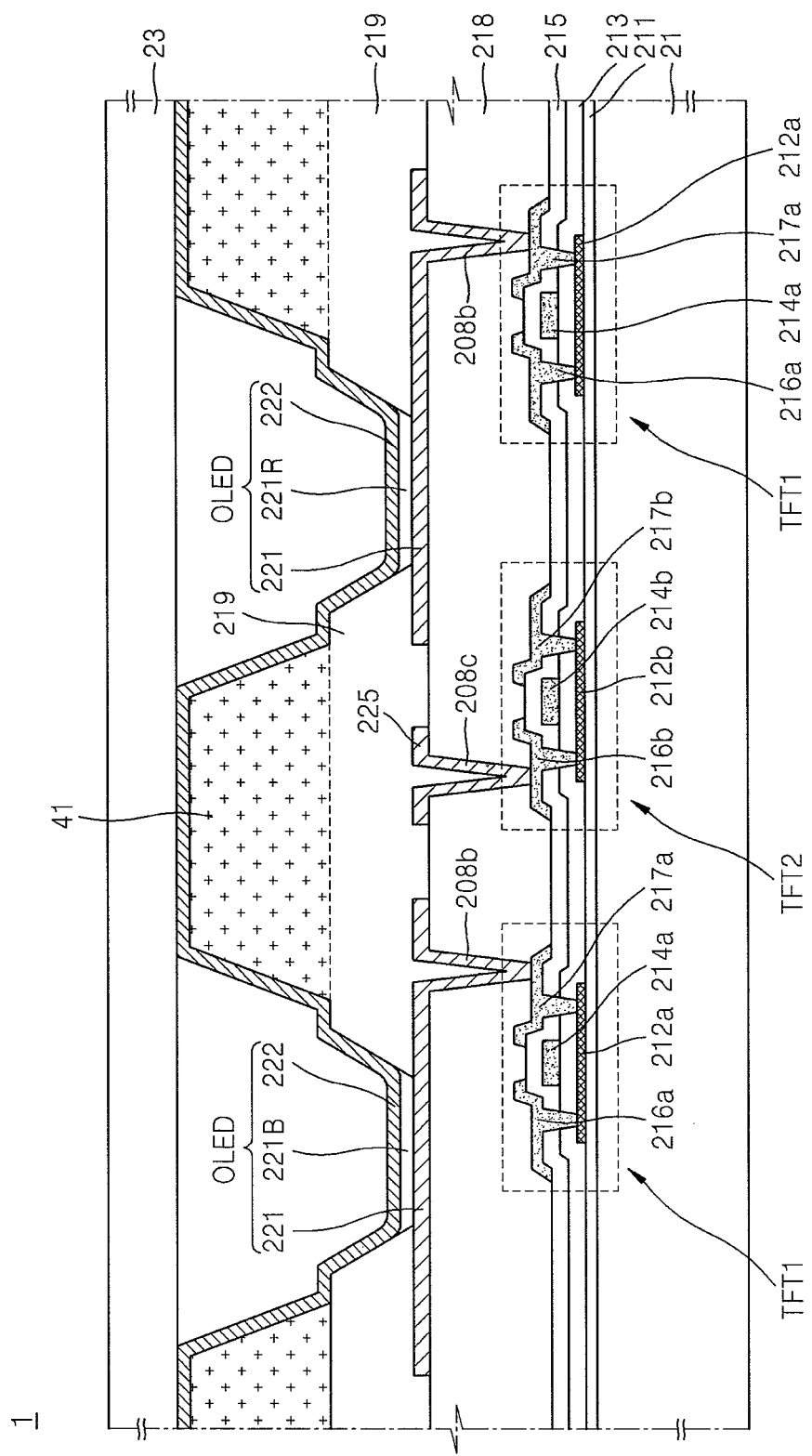
FIG. 3 is a partial cross-sectional view of the OLED display taken along the line I-I' of FIG. 2.

FIG. 3 is a partial cross-sectional view of the OLED display 1 taken along the line I-I' of FIG. 2.

Referring to FIG. 3, the OLED display 1 according to the present disclosure can include the display substrate 21, the encapsulation substrate 23, a buffer layer 211, a first thin film transistor TFT1, a second thin film transistor TFT2, the OLED, a pixel defining layer 219, and the spacer 41.

The display substrate 21 can include the non-pixel area NPA and the pixel areas PA. The display substrate 21 can be formed of transparent glass including $SiO_2$. The display substrate 21 is not limited thereto, and can be formed of another material such as a ceramic material, a transparent plastic material, or a metal material.

The encapsulation substrate 23 can be formed substantially opposite to the display substrate 21, and can encapsulate the OLED between the display substrate 21 and the encapsulation substrate 23 against environmental contaminants (e.g., oxygen and water).

The buffer layer 211 can prevent impurity ions from diffusing into an upper surface of the display surface 21, prevent moisture or air from infiltrating into the upper surface, and planarize the upper surface. In some embodiments, the buffer layer 211 is formed of an inorganic material (e.g., silicon oxide, silicon nitride, silicon oxynitride, aluminum oxide, aluminum nitride, titanium oxide or titanium nitride), an organic material (e.g., polyimide, polyester or acryl), or a laminate thereof. In some embodiments, the buffer layer 211 is not an essential element. The buffer layer 211 can be formed by various deposition methods such as plasma enhanced chemical vapor deposition (PECVD), atmospheric pressure CVD (APCVD), and low pressure CVD (LPCVD).

The first thin film transistor TFT1 can include an active layer 212a, a gate electrode 214a, a source electrode 216a, and a drain electrode 217a. A gate insulating layer 213 can be formed between the gate electrode 214a and the active layer 212a.

The active layer 212a can be formed on the buffer layer 211. An inorganic semiconductor (e.g., amorphous silicon or poly silicon) or an organic semiconductor can be used to form the active layer 212a. In some embodiments, the active layer 212a is formed of an oxide semiconductor. For example, the oxide semiconductor can include an oxide of metal elements such as zinc (Zn), indium (In), gallium (Ga), tin (Sn), cadmium (Cd), germanium (Ge), hafnium (Hf) or a combination thereof.

The gate insulating layer 213 can substantially cover the active layer 212a. The gate electrode 214a can be formed on the gate insulating layer 213.

An interlayer insulating layer 215 can be formed on the gate insulating layer 213 so as to so as to substantially cover the gate electrode 214a. The source electrode 216a and the drain electrode 217a can be formed on the interlayer insulating layer 215 so as to electrically connect to the active layer 212a through a contact hole.

The second thin film transistor TFT2 can include an active layer 212b, a gate electrode 214b, a source electrode 216b, and a drain electrode 217b. The gate insulating layer 213 can be formed between the gate electrode 214b and the active layer 212b.

The active layer 212b can be formed on the buffer layer 211. An inorganic semiconductor such as amorphous silicon or poly silicon or an organic semiconductor can be used to form the active layer 212b. In some embodiments, the active layer 212b can be formed of an oxide semiconductor. For example, the oxide semiconductor can include an oxide of metal elements such as zinc (Zn), indium (In), gallium (Ga), tin (Sn), cadmium (Cd), germanium (Ge), hafnium (Hf) or a combination thereof.

The gate insulating layer 213 can substantially cover the active layer 212b. The gate electrode 214b can be formed on the gate insulating layer 213.

The interlayer insulating layer 215 can be formed on the gate insulating layer 213 so as to substantially cover the gate electrode 214b. The source electrode 216b and the drain electrode 217b can be formed on the interlayer insulating layer 215 so as to electrically connect to the active layer 212b through a contact hole.

The first thin film transistor TFT1 can be a driving transistor electrically connected to the pixel areas so as to drive the pixel areas. The second thin film transistor TFT2 can be an initializing transistor electrically connected to the wiring 225 so as to initialize the pixel areas. However, the first and second thin film transistors TFT1 AND TFT2 are not limited thereto. The first and second thin film transistors TFT1 and TFT2 can be various transistors so as to drive the OLED display 1.

The first and second thin film transistors TFT1 and TFT2 are not limited to the above-mentioned structures, and can have other various structures. For example, the first and second thin film transistors TFT1 and TFT2 can have a top gate structure as described above, or can have a bottom gate structure in which the gate electrodes 214a and 214b are formed under the active layers 212a and 212b.

In addition to the first and second thin film transistors TFT1 and TFT2, a pixel circuit (not illustrated) including an additional transistor and a capacitor can be formed.

A planarizing layer 218 can be formed on the interlayer insulating layer 215 so as to at least partially cover the first and second thin film transistors TFT1 and TFT2. The planarizing layer 218 can remove a step and planarize a surface in order to improve light emission efficiency of the OLED formed on the polarizing layer 218.

The planarizing layer 218 can be formed of an inorganic material and/or an organic material. For example, the planarizing layer 218 can be formed of photoresist, acryl-based polymer, polyimide-based polymer, polyamide-based polymer, siloxane-based polymer, polymer including a photosensitive acryl carboxyl group, novolak resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, but is not limited thereto.

The OLED can be formed on the planarizing layer 218, and can include the pixel electrode 221, the intermediate layers 221R and 221B, and the opposite electrode 222. The pixel defining layer 219 can be formed on the planarizing layer 218 and the pixel electrode 221, and can define the pixel area PA and the non-pixel area NPA.

The intermediate layers 221B and 221R can be formed of a low molecular organic material or a polymeric organic material. When using the low molecular organic material, the intermediate layers 221B and 221R can be include an organic emission layer and can further include at least one of a hole injection layer (HIL), a hole transport layer (HTL), an electron transport layer (ETL), and an electron injection layer (EIL). The present embodiment is not limited thereto, and thus, the intermediate layers 221B and 221R can be provided with other various function layers in addition to the organic emission layer. These low molecular organic materials can be formed by vapor deposition. In some embodiments, the emission layers can be formed independently for each of a red pixel (R), a green pixel (G), and a blue pixel (B). The hole injection layer, the hole transport layer, the electron transport layer, and the electron injection layer can be common layers that can be applied to red, green, and blues pixels in common.

When the intermediate layers 221B and 221R are formed of the polymeric organic material, the intermediate layers 221B and 221R can include only the hole transport layer in a direction of the pixel electrode 221 with respect to the organic emission layer. The hole transport layer can be formed using an inkjet printing method or a spin-coating method.

Referring to the drawings, the second pixel 200 and the third pixel 300 can include the intermediate layers 221B and 221R that emit light of different colors. In some embodiments, the second pixel 200 can be a blue pixel; and the third pixel 300 can be a red pixel.

The pixel electrode 221 can be formed on the planarizing layer 218, and can be electrically connected to the drain electrode 217a through the first via hole 208a that penetrates the planarizing layer 218.

The pixel electrode 221 can serve as an anode electrode, and the opposite electrode 222 can serve as a cathode electrode, or vice versa.

When the pixel electrode 221 serves as the anode electrode, the pixel electrode 221 can be formed of ITO, IZO, ZnO, or $In_2O_3$ having a high work function. When the OLED display 1 is a top emission-type in which an image is formed away from the display substrate 21 towards the opposite electrode 222, the pixel electrode 221 can further include a reflective layer formed of Ag, Mg, Al, Pt, Pd, Au, Ni, Nd, Ir, Cr, Li, Yb, Ca, or a combination thereof. The pixel electrode 221 can have a single-layer or multi-layer structure formed of the above-mentioned metal and/or alloy. In some embodiments, the pixel electrode 221 includes a structure formed of ITO/Ag/ITO as a reflective electrode.

When the opposite electrode serves as the cathode electrode, the opposite electrode 222 can be formed of metal such as Ag, Mg, Al, Pt, Pd, Au, Ni, Nd, Ir, Cr, Li, or Ca. When the OLED display 1 is a top emission-type apparatus, the opposite electrode 222 can transmit light. In some embodiments, the opposite electrode 222 is formed of transparent conductive metal oxide such as ITO, IZO, ZTO, ZnO, or $In_2O_3$.

In another embodiment, the opposite layer 222 is formed as a thin film formed of at least one of Li, Ca, LiF/Ca, LiF/Al, Al, Ag, Mg, and Yb. For example, the opposite electrode 222 can include a single layer or multilayer formed of Mg:Ag, Ag:Yb and/or Ag. Unlike the pixel electrode 221, the opposite electrode 222 can be formed such that a common voltage is applied to all pixels.

The pixel defining layer 219 has a plurality of openings that expose the pixel electrode 221 so as to define the pixel area PA and the non-pixel area NPA. The pixel electrode 221, the intermediate layers 221B and 221R, and the opposite electrode 222 can be sequentially stacked in the opening of the pixel defining layer 219 so that the intermediate layers 221B and 221R can emit light. That is, a portion in which the pixel defining layer 219 is formed can substantially be the non-pixel area NPA, and the opening of the pixel defining layer 219 can substantially be the pixel area PA.

The wiring 225 can be formed between the second pixel 200 and the third pixel 300. The wiring 225 can include the third via hole 208c electrically connected to the second thin film transistor TFT2. The wiring 225 can be electrically connected to the source electrode 216b or the drain electrode 217b. Although the third via hole 208c is connected to the source electrode 216b in the drawings, this connection is merely an example and can be modified. Furthermore, the third via hole 208c can be electrically connected to another wiring connected to the second thin film transistor TFT2.

The spacer 41 can be formed on the pixel defining layer 219 and at least partially cover the second and third via holes 208b and 208c adjacent thereto. The spacer 41 can protrude from the pixel defining layer 219 toward the encapsulation substrate 23.

When the spacer 41 at least partially covers the second and third via holes 208b and 208c adjacent thereto, external light reflection by the second and third via holes 208b and 208c can be reduced.

In some embodiments, the pixel defining layer 219 and the spacer 41 are formed as one piece by a photolithographic process or a photo-etching process using a photosensitive material. That is, the pixel defining layer 219 and the spacer 41 can be substantially simultaneously formed by adjusting exposure through an exposure process using a half-tone mask.

In some embodiments, the half-tone mask can include a transmittance area, a semi-transmittance area, and a non-transmittance area. The opening of the pixel defining layer 219 can be formed corresponding to the transmittance area of the half-tone mask. The pixel defining layer 219 can be formed corresponding to the semi-transmittance area. The spacer 41 can be formed corresponding to the non-transmittance area. In this case, the spacer 41 is formed of the same material as that of the pixel defining layer 219.

In some embodiments, in the half-tone mask for manufacturing the OLED display 1, the transmittance area is adjacent to the non-transmittance area so that a reflow phenomenon of an organic layer can be reduced in comparison to when the transmittance area is adjacent to the semi-transmittance area. Therefore, impurities can be prevented from infiltrating into the pixel areas while the spacer 41 is formed.

However, the present disclosure is not limited thereto. Therefore, the pixel defining layer 219 and the spacer 41 can be formed sequentially or separately, and can be individual structures formed of different materials.

Figure 4:
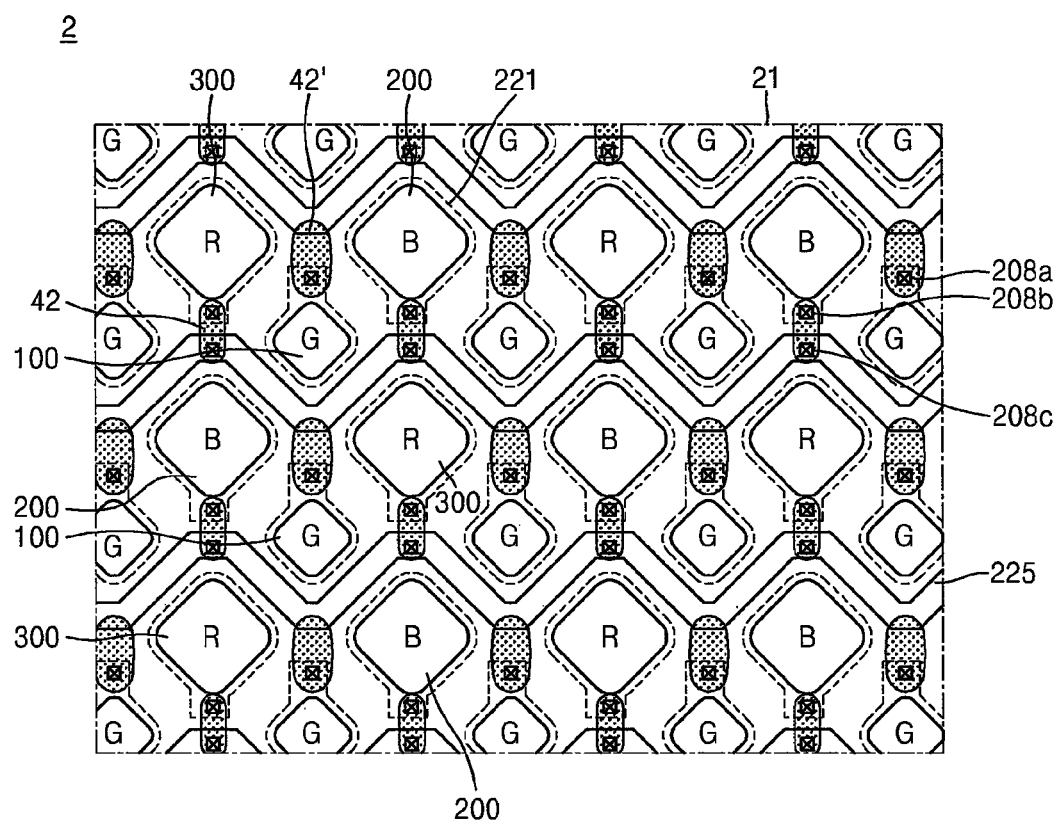
FIG. 4 is a partial planar view of an OLED display according to another embodiment.
Figure 5:
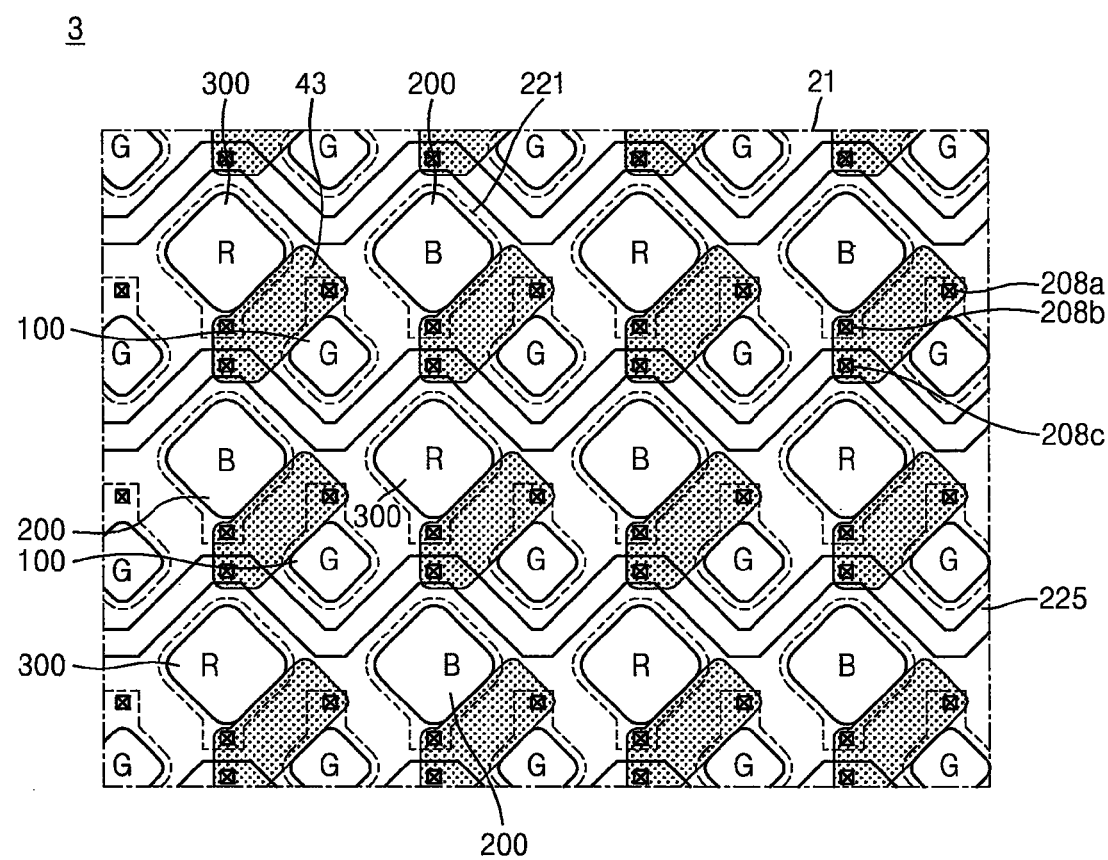
FIG. 5 is a partial planar view of an OLED display according to another embodiment.

FIGS. 4 and 5 are partial planar views of OLED displays 2 and 3 according to other embodiments. In FIGS. 4 and 5, the same reference numerals as those of FIG. 2 refer to the same members. Therefore, overlapping descriptions for the same members are omitted below.

Referring to FIGS. 4 and 5, the OLED displays 2 and 3 are different from the OLED display 1 of FIG. 2 in that spacers 42, 42' and 43 are different from the spacer 4.

The spacers 42 and 42' of FIG. 4 at least partially cover at least one of the first to third via holes 208a to 208c. The spacers 42 and 42' are hereinafter referred to "first spacer 42" and "second spacer 42".

The first spacer 42 can be formed to at least partially cover two adjacent via holes among the first to third via holes 208a to 208c. In some embodiments, the first spacer 42 covers the second via hole 208b and the third via hole 208c.

The second spacer 42' can be formed to at least partially cover one of the first to third via holes 208a to 208c. In some embodiments, the first to third via holes 208a to 208c are at least partially covered by the first and second spacers 42 and 42'. Therefore, mechanical strength of the OLED display 2 can be improved, and the external light reflection due to the first to third via holes 208a to 208c can also be reduced.

The spacer 43 of FIG. 5 at least partially covers at least one of the first to third via holes 208a to 208c formed in the non-pixel areas. The spacer 43 can be formed to at least partially cover three adjacent via holes. At least one edge of the spacer 43 contacts an edge of the pixel area PA.

In some embodiments, the spacer 43 is formed to at least partially cover the first to third via holes 208a to 208c. The first via hole 208a can be formed in the pixel electrode 221 of the first pixel 100 so as to electrically connect the first pixel 100 to a device that drives the first pixel 100. The second via hole 208b can be formed in the pixel electrode 221 of the second pixel 200 or the third pixel 300 so as to electrically connect the second pixel 200 or the third pixel 300 to a device that drives the second pixel 200 or the third pixel 300. The third via hole 208c can be formed in the wiring 225 so as to electrically connect the wiring 225 to a lower wiring or a lower device.

In some embodiments, the spacer 43 can include an edge that contacts and edge of an adjacent pixel area PA. The spacer 43 can include an edge that contacts an edge of the first pixel 100 and an edge of the second pixel 200. The spacer 43 can include an edge that contacts an edge of the first pixel 100 and an edge of the third pixel 300. In this case, an inclined surface of the spacer 43 is integrally formed with an inclined surface of the pixel defining layer 219. That is, the spacer 443 does not form a step with the pixel defining layer 219. Therefore, a reflow phenomenon due to curing can be reduced during a process of forming the spacer 43 and the pixel defining layer 219.

As described above, the OLED displays 1 to 3 according to the present disclosure can have the pixel arrangement for improving the aperture ratio. The OLED displays 1 to 3 can have the spacers 41, 42, 42' and 43 that are robust against external impact and can reduce the external light reflection. Thus, the reliability of the OLED displays 1 to 3 can be improved.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the described invention have been described with reference to the figures, it will be understood by those of ordinary skill in the art that various changes in form and details can be made therein without departing from the spirit and scope of the present invention as defined by the following claims.

What is claimed is:

1. An organic light-emitting diode (OLED) display, comprising:
    a display substrate comprising an edge circuit portion and a display portion, the display portion including a plurality of pixel areas and a non-pixel area forming an area on which an image is displayed, wherein the non-pixel area surrounds and separates the pixel area and wherein a plurality of via holes is formed in the non-pixel area;
    an encapsulation substrate facing the display substrate; and
    a plurality of spacers formed on the non-pixel area between the display substrate and the encapsulation substrate so as to maintain a gap between the display substrate and the encapsulation substrate, wherein each spacer does not surround the pixel areas,
    wherein each of the spacers at least partially covers at least one of the via holes, wherein at least one of the spacers entirely covers two adjacent via holes within the area of the image displayed.

2. The OLED display of claim 1, wherein the spacers at least partially cover three adjacent ones of the via holes.

3. The OLED display of claim 1, wherein at least one edge of each spacer contacts an edge of the pixel area.

4. The OLED display of claim 1, wherein, from a top view of each spacer, the spacer has one of the following shapes: a polygon, a circle, or an ellipse.

5. The OLED display of claim 1, wherein at least one of the via holes is electrically connected to a transistor configured to drive the pixel areas.

6. The OLED display of claim 1, wherein each of the pixel areas comprises a pixel electrode, an intermediate layer including an organic emission layer, and an opposite electrode, and wherein a portion of at least one of the via holes is formed in the pixel electrode.

7. The OLED display of claim 1, wherein a portion of at least one of the via holes is formed in a wiring formed between the pixel areas.

8. The OLED display of claim 7, wherein the wiring is a supply line configured to supply power for initializing the pixel areas.

9. The OLED display of claim 1, wherein the pixel areas comprise:
    a first pixel;
    at least one second pixel spaced apart from the first pixel and having a center positioned on a first vertex of a virtual quadrangle, wherein the virtual quadrangle has a center positioned on a center of the first pixel; and
    at least one third pixel spaced apart from the second pixel and having a center positioned on a second vertex adjacent to the first vertex.

10. The OLED display of claim 9, wherein the at least one second pixel comprises a plurality of the second pixels, and the second pixels are spaced apart from one another having the first pixel therebetween.

11. The OLED display of claim 9, wherein the at least one third pixel comprises a plurality of the third pixels, and the third pixels are spaced apart from one another having the first pixel therebetween.

12. The OLED display of claim 9, wherein the at least one second pixel comprises a plurality of the second pixels and the at least one third pixel comprises a plurality of the third pixels, and wherein the second pixels and the third pixels are alternately formed on a virtual line so as to substantially surround the first pixel.

13. The OLED display of claim 9, wherein each of the second and third pixels has a larger area than that of the first pixel.

14. The OLED display of claim 9, wherein the first to third pixels are configured to emit light of different colors.

15. The OLED display of claim 9, wherein the first to third pixels are configured to emit green light, blue light, and red light, respectively.

16. The OLED display of claim 1, wherein each of the spacers substantially completely covers the via hole.

17. The OLED display of claim 1, wherein at least one of the via holes is electrically connected to a source electrode of a transistor configured to initialize the pixel areas.

18. An organic light-emitting diode (OLED) display, comprising:

a display substrate comprising an edge circuit portion and a display portion, the display portion including at least one pixel area and a non-pixel area forming an area on which an image is displayed, wherein a plurality of via holes are formed in the non-pixel area;

an encapsulation substrate formed over the display substrate; and at least one spacer formed between the display substrate and the encapsulation substrate so as to maintain a gap therebetween, wherein a portion of a least one of the via holes is formed in a wiring formed between the pixel areas, wherein each of the pixel areas comprises a pixel electrode, an intermediate layer including an organic emission layer, and an opposite electrode, wherein the spacer at least partially covers at least one of the via holes, wherein the spacer entirely covers two adjacent via holes within the image displayed wherein one of the two adjacent via holes is disposed in the wiring and the other of the two adjacent via holes is disposed in the pixel electrode, and wherein the pixel electrode is disposed in a same layer as the wiring; and wherein the at least one spacer does not surround the at least one pixel area.

19. The OLED display of claim 18, wherein, from a top view of each spacer, the spacer has one of the following shapes: a polygon, a circle, or an ellipse.

* * * * *